United States Patent [19]
Fasano et al.

[11] Patent Number: 5,846,361
[45] Date of Patent: Dec. 8, 1998

[54] LAMINATION PROCESS FOR PRODUCING NON-PLANAR SUBSTRATES

[75] Inventors: Benjamin Vito Fasano, New Windsor; Mark J. LaPlante, Walden; David Clifford Long, Wappinger Falls; Keith Colin O'Neil, Hughsonville; Brenda Lee Peterson, Wappingers Falls; Glenn A. Pomerantz, Kerhonkson, all of N.Y.; Timothy Titus Popp, Knoxville, Tenn.

[73] Assignee: International Business Machines Corporation, Armonk, N.Y.

[21] Appl. No.: 721,570

[22] Filed: Sep. 26, 1996

Related U.S. Application Data

[62] Division of Ser. No. 460,307, Jun. 2, 1995, Pat. No. 5,645,673.

[51] Int. Cl.⁶ .............................. B32B 31/18; B32B 31/26
[52] U.S. Cl. ................... 156/89.16; 156/89.12; 156/89.28; 156/154; 156/247; 156/268
[58] Field of Search .................... 156/247, 268, 156/89, 252, 344, 154, 89.12, 89.16, 89.28

[56] References Cited

U.S. PATENT DOCUMENTS

| | | | |
|---|---|---|---|
| 3,770,529 | 11/1973 | Anderson | 156/89 X |
| 3,948,706 | 4/1976 | Schmeckenbecker | 156/89 |
| 3,956,052 | 5/1976 | Koste | 156/247 |
| 4,045,412 | 8/1977 | Yamada et al. | |
| 4,546,065 | 10/1985 | Amendola et al. | |
| 4,837,408 | 6/1989 | Kondo et al. | 246/61 X |
| 4,872,947 | 10/1989 | Wang et al. | 156/643 |
| 4,892,753 | 1/1990 | Wang et al. | 427/38 |
| 5,144,534 | 9/1992 | Kober | 361/398 |
| 5,145,551 | 9/1992 | Brooke et al. | 156/626 |
| 5,176,771 | 1/1993 | Bravo et al. | 156/85 |
| 5,240,671 | 8/1993 | Carey | 419/9 |
| 5,294,567 | 3/1994 | Dorfman et al. | |
| 5,435,875 | 7/1995 | Saitoh et al. | 156/89 X |
| 5,478,420 | 12/1995 | Gauci et al. | 156/89 |
| 5,522,963 | 6/1996 | Anders, Jr. et al. | 156/247 X |

*Primary Examiner*—Curtis Mayes
*Attorney, Agent, or Firm*—Perman & Green, LLP

[57] ABSTRACT

Forming a green multi-layer component with an embedded pattern of barrier material, which may be in the form of a positive pattern to form a recessed area or in the form of a negative pattern to form raised areas on the component. Peripheral channels are machined into the green laminate surface to outline each negative or positive pattern feature, the channels being cut deep and wide enough to contact and overlap the edges of the barrier material. The layer of barrier material and the overlying layer(s) of ceramic material are separated from the remainder of the component to produce a non-planar part having raised areas in the case of a negative pattern of barrier material or a part having recessed areas in the case of a positive pattern of barrier material. An apparatus and process to control the machining depth of cut using both AC and DC sensing techniques is disclosed. The non-planar component may be provided with recessed surface metallurgy, such as seal bands and filled via connections, which can survive planarization.

8 Claims, 5 Drawing Sheets

LAMINATION PROCESS FOR PRODUCING NON-PLANAR SUBSTRATES

This is a divisional of application Ser. No. 08/460,307 filed on Jun. 2, 1995, now U.S. Pat. No. 5,645,673.

BACKGROUND OF THE INVENTION

1. Field of the Invention

Non-planar ceramic chip carriers, i.e., those containing raised regions or recessed cavities, are sometimes required for specific applications. Processes for producing packages containing cavities or raised areas involve numerous steps which add to the cost. These can include forming cavities in greensheets by processes such as laser machining or mechanical punching, and the subsequent lamination of the stacked sheets with inserts to maintain the shape of the cavities.

There are numerous tools and devices which must be maintained, and handled, to support these processes which are unique to non-planar substrates. Hard tooling such as inserts and mechanical punches are product-specific, are expensive and often have a long lead time for each new product design and material. The present invention relates to simple, flexible methods to produce non-planar substrates.

2. Description of Related Art

Multi-layer substrates for producing packages or carriers for electronic circuits can be produced from unfired ceramic tape in many configurations. The most often used process involves the production of a 'greensheet' by casting a suspension of ceramic powders onto a metal or polymer film using a well known doctorblade process. These greensheets can be cut, punched, screened with pastes containing metal powders to form conductive patterns and subsequently laminated, usually at elevated temperature and pressure, to form a laminate. These laminated greensheets can then be heated (sintered) to produce a durable substrate for use in packaging electronic devices.

In some instances, the electronic device may need to be recessed below the outermost surface of the substrate. In this case, a recess or cavity can be formed in the substrate. This could allow, for instance, the use of wirebond interconnections within the cavity between the substrate and the integrated circuit. Since the greensheets are usually laminated under considerable pressure, there is a tendency for the layers within the cavity to distort unless they are restrained by an insert placed into the cavity before lamination. These inserts can be made from hard materials or have a hard surface to cause, for instance, wirebond traces to become embedded into the greensheet to produce a planar surface on the wirebond shelf after lamination.

Cavity inserts present several problems in a manufacturing environment. To reduce surface imperfections which can result from dirt and/or irregularities in the surface finish of the insert, the inserts can be made from hardened metals. These inserts may be lapped to produce an ultra smooth finish. The inserts are also made to extremely tight tolerances in all dimensions. Furthermore, each insert may need to be thoroughly cleaned prior to each use, which requires cleaning equipment and personnel and additional support processes. Cleaning also necessitates that many additional inserts be fabricated because of the turn-around time of the cleaning loop. Cavitied substrates also require other operations which include setting the insert into the stacked greensheets prior to lamination and removing them afterwards. This not only requires extra time, but may also subject the inserts to handling damage requiring their replacement. Difficulties may also arise when it is required to form complex cavities, such as cavities which extend through the substrate and/or those with more than two tiers, very small cavities and those with complex shapes.

The formation of cavities in the greensheets, prior to screening and lamination, can be accomplished by several mechanical means. Cavities can be formed by programmable tooling such as a $CO_2$ laser or by mechanical step and repeat punching. These can be programmed to form any shape cavity but are generally too slow for volume production. Additionally, large amounts of debris can be formed by cavity formation processes requiring separate cleaning steps. This debris can contaminate screened features (eg. wirebond pads or seal bands) when they are screened prior to cavity formation and can cause defects in the substrate after sintering. A fixed punch and die set can also be designed and built to produce cavities but this usually requires a long turn-around time and is very expensive. Although it is capable of high throughputs, it is not practical for small to medium volume runs, and it may not be capable of forming cavities after screening. This is sometimes required when it is not possible to screen after forming cavities. In this case laser cavity formation may be the only solution. Mechanical cavity formation in unfired tapes or laminates is also not practical for very small or complex cavities.

It has been proposed by U.S. Pat. No. 5,240,671 to form cavities in ceramic layers by casting a ceramic slurry into a mold containing protrusions. This is not practical for a manufacturing process due to the handling and flexibility concerns, as well as the difficulty of having conductive metal embedded within the package.

It has also been proposed by U.S. Pat. No. 5,176,771 to form surface cavities in a laminated multi-layer ceramic substrate by the application of an outer surface material having a different thermal shrinkage rate than that of the remainder of the substrate, whereby delamination of said material occurs during the baking operations to leave a surface cavity in the substrate.

Still other patents propose cavity formation produced by machining the fired substrate with abrasive tooling or processes. These are very slow and expensive.

SUMMARY OF THE INVENTION

The present invention provides a novel process which is simpler and cleaner than the prior known processes, and involves the steps of forming a green multi-layer laminate with selective areas of barrier sheet material, which may be in the form of a positive pattern to form a recessed area or in the form of a negative pattern to form raised areas on the substrate. The adhesion of the barrier layer material may be tailored to suit the requirements of the feature to be produced. Thereafter narrow peripheral channels are machined in the green laminate surface to outline each positive or negative pattern feature, the channels being cut deep and wide enough to contact and overlap the edges of the barrier layer sheet material. The final step involves separation of the layer of barrier material and the overlying layers of the ceramic dielectric material from the remainder of the substrate to produce a non-planar substrate having raised areas in the case of a negative pattern of barrier material or a substrate having recessed areas in the case of a positive pattern of barrier material. The non-planar substrate is ready for sintering and/or other appropriate processing.

The invention also provides a method to control the machining process by providing highly accurate sensing of the location of a barrier layer within a substrate using electrical means.

The invention further provides additional capabilities for creating, for instance, surface metallization which can be patterned and deposited onto a substrate which will survive planarization after sintering. This can eliminate the need for post-fire metallization processes using thick film inks or thin film tooling for substrates that need to be planarized for joining or sealing purposes.

THE DRAWINGS

In the accompanying figures,

FIG. 1 is a diagrammatic cross-section, to an enlarged scale, of a plurality of screened greensheets with interposed patterned layers of barrier layer materials adhered or "tacked" to the undersurface of the greensheet carrying the screened metallurgy to be exposed during the formation of a non-planar, multi-layer substrate, the greensheets being depicted in spaced relations for purposes of illustration;

FIG. 2 is a diagrammatic illustration of the step of machining or routing an area of the uppermost greensheet of the laminate down to the surface of the patterned barrier layer material tacked to the undersurface thereof using a milling cutter which is guided to overlap and expose the edge of the positive pattern layer material, around the entire periphery thereof; and FIG. 3 is a diagrammatic illustration of a formed non-planar multi-layer substrate formed by cutting through different areas of the greensheet layer of FIG. 1, down to the barrier layer material outlines, and peeling away the barrier layer material and the portions of the greensheet layers superposed thereon.

DETAILED DESCRIPTION

The present invention relates to a novel process for producing non-planar multi-layer substrates comprising a plurality of ceramic greensheets, and involves the novel steps of interposing a thin layer of barrier material, e.g. a thin film such as Mylar polyester, at strategic locations between two or more of the layers of ceramic greensheets during the assembly and lamination thereof to form the multi-layer substrate, milling or machining through the multi-layer substrate down to the upper surface of the layer of barrier material to overlap and expose the edge of the barrier material, which may be the outer edge of a positive pattern of such material when producing a recessed area, or the inner edge of an opening or negative pattern in such barrier layer material when producing a raised area, and then separating the layer of barrier material from the greensheet layers therebeneath to remove therewith all of the milled or machined greensheet layer portions overlying the separated layer of barrier material. The milling or machining is controlled so as to overlap the edge of the barrier layer around the entire periphery thereof exposing said edge and enabling it to be engaged for lift-off removal. During the milling operation the areas of the laminate which overly the barrier layer may be removed to expose, for instance, underlying metallurgy and produce a non-planar substrate having raised areas or recessed areas, ready for sintering.

Figure 1:
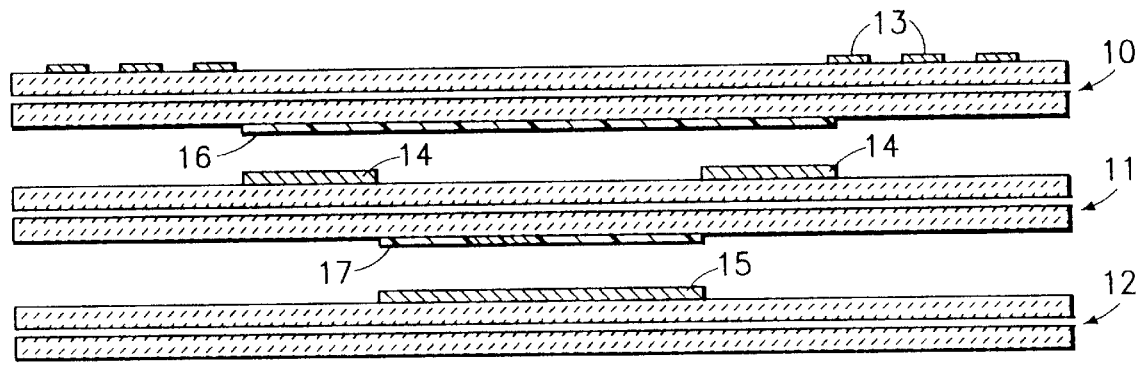

Referring to the drawings, FIG. 1 illustrates a plurality of ceramic greensheets 10, 11 and 12, each of which is pre-patterned with desired metallurgy 13, 14 and 15 on the upper surface. In order to expose the underlying metallurgy 14 and 15 for contact at the face of the multi-layer sublaminate unit, the unit must be formed as a non-planar unit having a central recess area.

This is accomplished cleanly and conveniently, according to the novel process of the current inventions, by first cutting and tacking a positive pattern layer of barrier material such as 0.5 mil thick Mylar, to the undersurface of each greensheet which is to be positioned adjacent and above a greensheet carrying, for instance, metallurgy to be exposed. Referring to FIG. 1, the barrier layers 16 and 17 are positive pattern layers, layer 16 being affixed to the undersurface of greensheet 10 in predetermined alignment to overlie metallurgy 14, and barrier layer 17 being affixed to the undersurface of greensheet 11 in predetermined alignment to overlie metallurgy 15 on the upper surface of greensheet 12.

Figure 2:
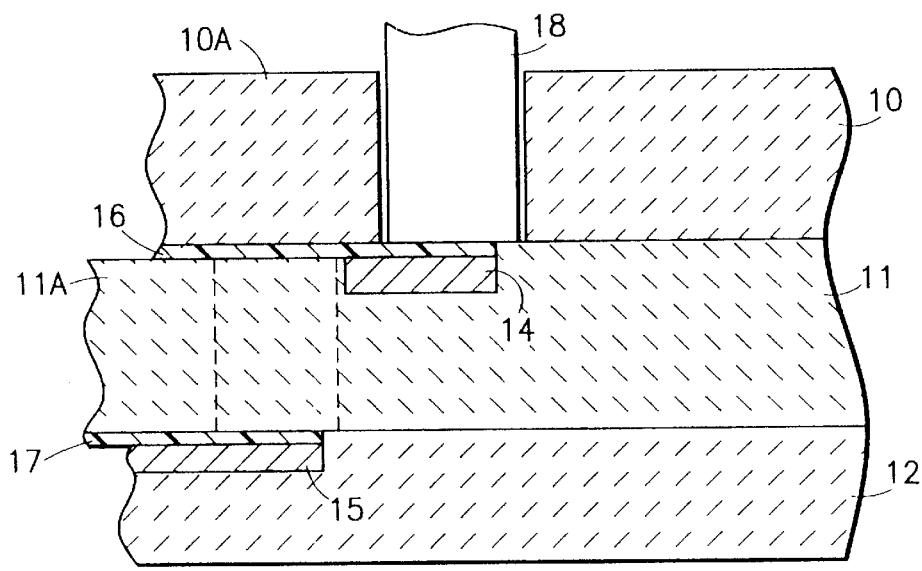

The aligned greensheets are laminated and ready for milling or machining. The first milling operation step is illustrated by FIG. 2 of the drawings, using a milling cutter tool 18 which is guided to cut through the greensheet 10 down to the upper surface of the barrier layer 16 and to overlap the edge of the barrier layer 16 as it is guided around the entire periphery of the barrier layer 16, This exposes the entire outline of the barrier layer 16 and enables an edge of the barrier layer 16 to be engaged, such as by tweezers or other implement and removed from the underlying greensheet 11 and the metallurgy 14 thereon, carrying with it the cut portion 10A of the upper greensheet 10. The removal of central portion 10A of the upper greensheet 10 exposes the central portion 11A of the next greensheet 11 for the second milling step.

The second milling step is conducted by guiding the milling tool 18 to cut through the middle greensheet 11, down to the upper surface of the barrier layer 17, and guiding the tool 18 to overlap the edge of layer 17 around the entire periphery thereof, in the same manner as with the first barrier layer material 16. This cutting step exposes the entire periphery of the barrier layer 17 and enables an edge thereof to be engaged and lifted away from the upper surface of the bottom greensheet 12, carrying with it the cut portion 11A of the greensheet 11, to expose the metallurgy 15 present on the upper surface of the bottom greensheet 12, to produce a non-planar substrate 19 as illustrated by FIG. 3.

Figure 3:
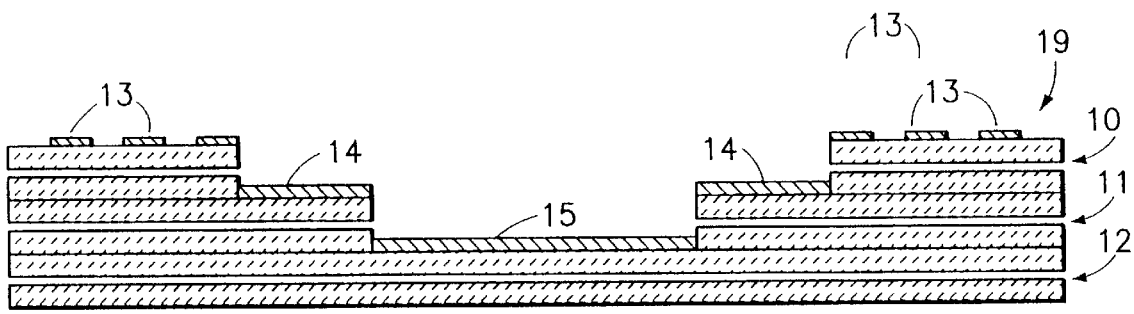

The substrate 19 of FIG. 3 comprises a central recessed area having exposed metallurgy 14, such as wirebond pads, and exposed metallurgy 15, such as a die attach layer, and is ready for sintering or further processing.

A preferred method for cutting and attaching the pattern layer of barrier layer material to the undersurface of greensheets, such as layer 16 on greensheet 10 and layer 17 on greensheet 11, involves the use of electron beam or laser machining techniques and full sheets of flexible thermoplastic barrier layer material such as Mylar which is from about 0.5 mil up to 5 mils in thickness.

In this method, the Mylar is cut to size and "tacked" to the side of the sheet 10 or 11 adjacent to the desired feature (see FIG. 1). This can be done simply by using a CO2 laser (or other appropriate laser or radiation means) on an XY translation stage. The Mylar is placed onto the greensheet. The desired pattern is precisely cut-out at a power high enough to cut and fuse the Mylar at its perimeter but not high enough to cut completely through the greensheet. The surrounding Mylar negative pattern is removed and discarded and the positive pattern Mylar 'coupon' is left fused to the sheet, attached at its perimeter. The layers are then stacked and laminated. During milling the milling cutter is extended until it touches the top of the Mylar barrier layer. Sensing techniques can be used to control the depth of cut. The cutter then only routes out the perimeter of the Mylar to expose its edges. Then the ceramic overlying the Mylar can be removed in one piece along with the Mylar eliminating the need to mill the entire area of ceramic. With the Mylar removed the features below the barrier layer have been protected from the milling operation and are now exposed. Milling can now proceed in a similar manner to process subsequent tiers if necessary.

It will be apparent to those skilled in the art that the present process can be automated for precisely cutting, tacking, and locating the barrier layer material patterns onto the greensheet layers, and for the precision milling or machining of the greensheet portions, around the periphery or edge of the barrier layer material.

Although the process for applying a barrier layer as described here utilizes a solid film that is cut from a sheet of film, it is recognized that a release layer can also be applied in specific areas by other techniques. These can include application of a solution or paste through a mask, evaporation deposition, spraying or other pattern defining techniques. The barrier layer can be composed of an organic, inorganic or a mixture of both.

The nature of the barrier layer can also be such that it and the overlying ceramic need not be removed after milling the perimeter of the feature and prior to sintering. If, for instance, a cellulose based material is used to form the release layer, the milling can stop within this layer and not require its removal. During sintering the cellulose will burn off leaving a non-adherent residue. This allows the overlying layers to be removed after sintering.

Figure 4:
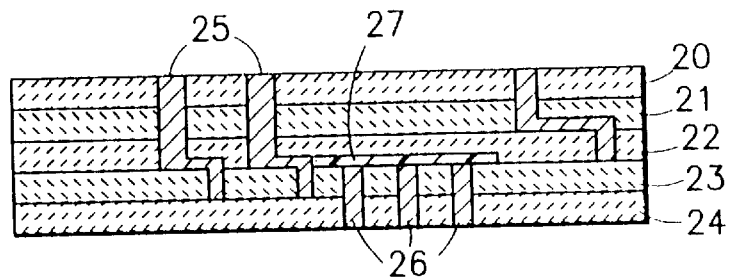
FIG. 4 is a diagrammatic cross-sectional illustration of a laminate of a plurality of ceramic greensheets containing various internal metallurgies, prior to cavity formation.

Inorganic barrier layers can also be selected that can be left in the cavity during sintering and then can be removed in whole or as non-adherent powder afterwards. Boron nitride has been found to prevent adhesion of sintered ceramic layers when introduced between greensheets prior to lamination. Used as a barrier layer, only the perimeter of the desired features needs to be milled to the depth of the release layer. After sintering the overlying ceramic can be removed since it does not adhere to the cavity. An additional benefit of the use of milling to form cavities includes the ability to produce surface features which can survive post-sinter planarization or grinding when flat substrate regions are desired. Referring to the drawings, FIG. 4 illustrates a plurality of greensheets 20, 21, 22, 23, 24 with conductive metallurgies such as vias and lines 25 and 26, and with a barrier layer 27 buried between layers 22 and 23.

Figure 5:
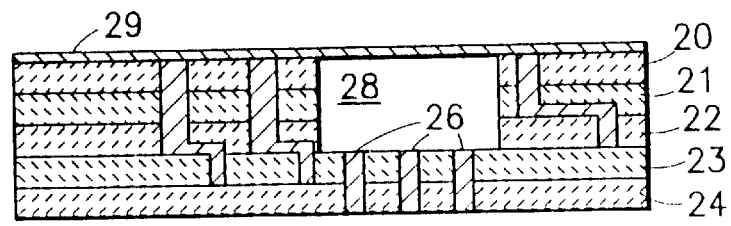
FIG. 5 illustrates the laminate of FIG. 4 after the step of milling a major cavity through the uppermost greensheet layers and application of a barrier masking layer thereover.
Figure 6:
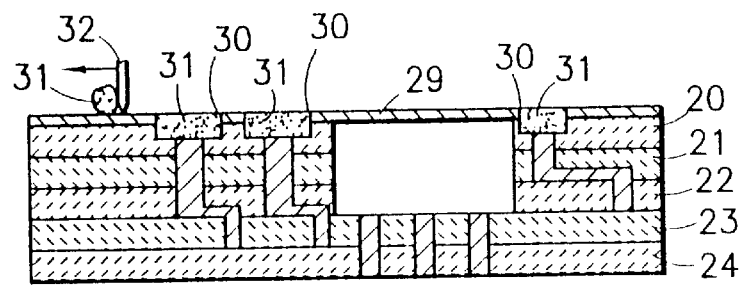
FIG. 6 illustrates the laminate of FIG. 5 after the step of milling additional cavities through the masking layer and into the uppermost greensheet layer, and during the step of filling of such additional cavities with conductive paste compositions.
Figure 7:
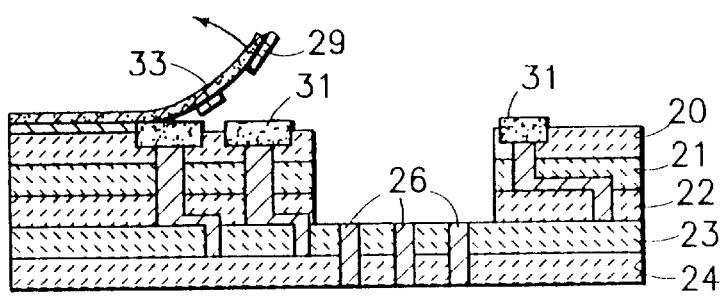
FIG. 7 illustrates the laminate of FIG. 6 during the step of removal of the masking layer by means of an adhesive tape layer applied thereover.
Figure 8:
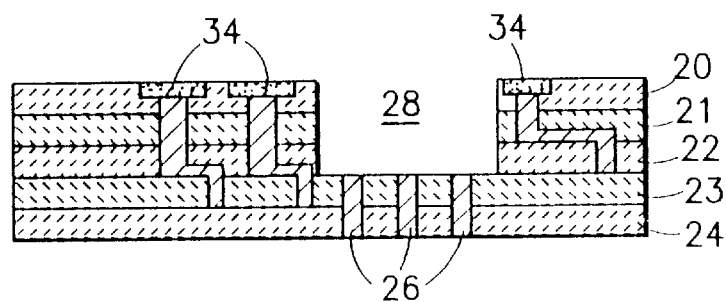
FIG. 8 illustrates the laminate of FIG. 7 after removal of the masking layer and subsequent sintering.

Referring to FIG. 5, after the cavity 28 has been milled by cutting the outline or periphery thereof through layers 20, 21, and 22 to overlap the outline of the barrier layer 27, the overlying ceramic is removed with the barrier layer to form the cavity 28 with the internal metallurgy 26 exposed at the base thereof. Next, the entire surface of the laminate can be covered with an adhesively backed masking film 29 such as a low-tack polymer tape. Thereafter, surface features or holes 30 are milled through the tape into the ceramic layer 20 and surface vias 25 to the desired depth. A paste 31 consisting of the desired metallization and a binder is then pressed or squeegeed into the milled holes 30 using a straight edge scraper 32 or similar deposition technique as shown in FIG. 6. The paste 31 can then be cured by drying, heating or other processes. The surface of the masking film 29 is then wiped clean and the film 29 is then removed, using an adhesive tape 33 or other method to lift the film 29 off the substrate as shown in FIG. 7. The substrate can now be sintered to consolidate the ceramic and or metallization features. Due to the depth of the surface metallization, these features will remain after a planarization step such as grinding, lapping or polishing, to provide metallized electrically and/or thermally conductive or insulative and/or sealing regions as shown in FIG. 8.

It should be realized that although metallization pastes are described here, glass, ceramic and/or other organic and inorganic materials can be also be used to fill the milled features. Additionally, surface features can be produced that are not electrically connected to internal features, for instance to make sealbands.

Another method to mask the substrate can also include the use of a masking film 29 which is removed by dissolution. The film 29 can be applied as above or applied by spraying or coating the surface of the substrate. Films such as methyl cellulose or hydroxyethylcellulose can be used if the paste and substrate are not soluble in water. After paste curing, the film 29 can be removed by immersion in a suitable solvent to soften and delaminate and/or dissolve the film, leaving behind the insoluble paste area 31 and the substrate layer 20.

In some applications a greensheet can be used for the masking layer when the presence of residual pastes after, for instance, applying a paste to the milled feature and cleaning the surface, will not affect the subsequent performance of the substrate. In this case the masking greensheet can be laminated with the desired greensheets, or in a later lamination process. During grinding the outermost layers of the greensheet including any residual paste on this surface can be removed.

Figure 9:
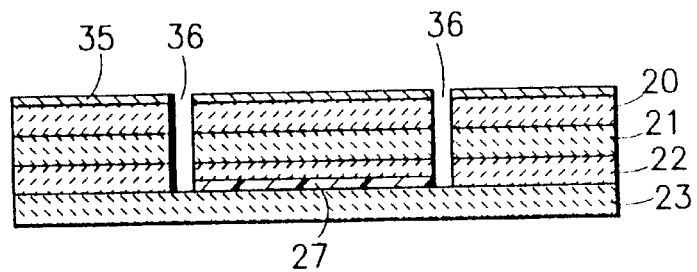
FIG. 9 is a diagrammatic cross-sectional illustration of a laminate of a plurality of ceramic greensheet layers covered with a top non-bonding masking layer and having the outline perimeter of a proposed major cavity milled through the masking layer and through several of the underlying greensheet layers.
Figure 10:
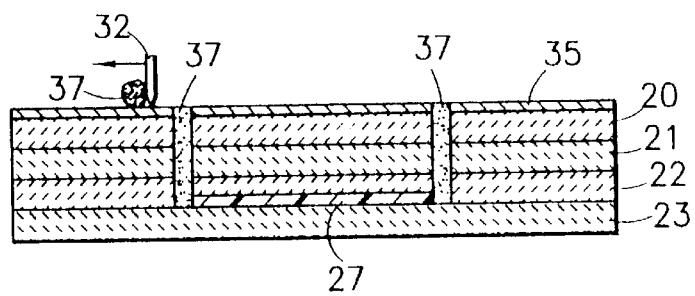
FIG. 10 illustrates the milled laminate of FIG. 9 during the step of applying conductive paste through the masking layer to fill the milled cavity perimeter.
Figure 11:
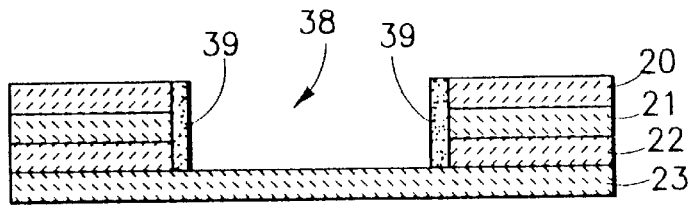
FIG. 11 illustrates the laminate of FIG. 10 after removal of the masking layer and milling of the major cavity having metallized sidewalls.

As illustrated by FIGS. 9–11, this same patterning method can also be used to produce non-planar features which have metallized sidewalls. A masking layer 35 is applied to the substrate surface. Channels 36 are then milled through the mask to the desired depth of metallization as shown in FIG. 9, in which the channels 36 overlap the periphery or edges of the barrier layer 27. These channels 36 are then metallized using the previously described techniques as shown in FIG. 10. After the paste 37 has been cured, the perimeter of the cavity 38 is milled by partially cutting through the metallization 37 down to the barrier layer 27 and removing the overlying ceramic leaving the cavity 38 having metallized sidewalls 39 intact as shown in FIG. 11. It should be apparent that a soluble masking layer 35 as described earlier could also be used.

Figure 12:
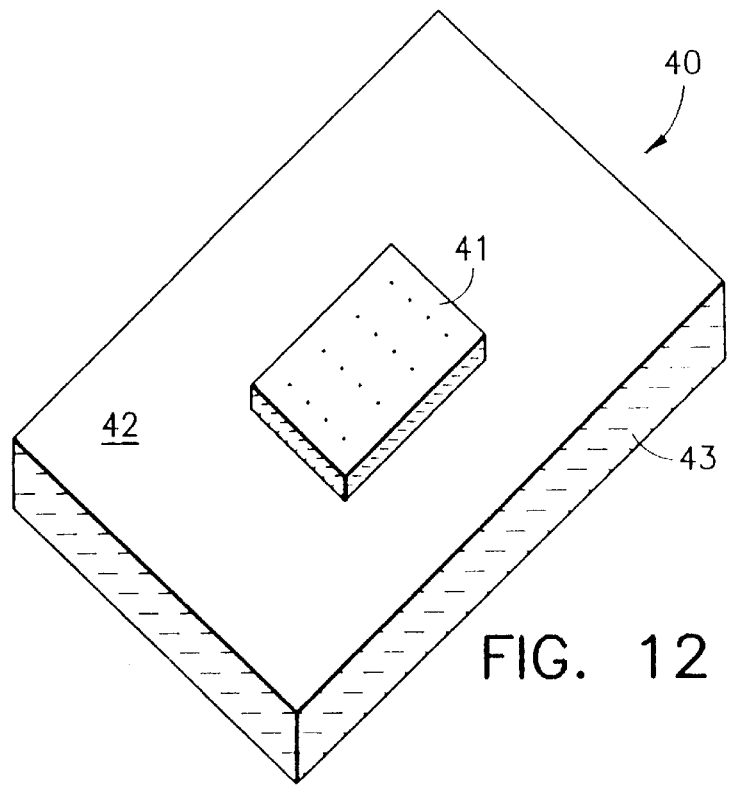
FIG. 12 illustrates a laminate produced by the use of a negative barrier layer to produce raised features on a component.

While FIGS. 1–3 illustrate the formation of non-planar multi-layer ceramic substrates having a cavity or central recessed contact area, it will be clear to those skilled in the art that non-planar substrate 40 having raised central areas 41 and recessed outer contact areas 42 can be produced in similar fashion through the use of negative pattern barrier layers, i.e., having central cutout areas surrounded by peripheral barrier layer material areas which can be removed leaving raised features on the substrate as illustrated by FIG. 12.

Controlling the depth of the milling cutter so that it touches the top of a thin (approx 1 mil thick) barrier layer can be difficult, especially since each of the greensheets used to make an unfired laminate can vary by 0.5 mil or more in thickness.

Figure 13:
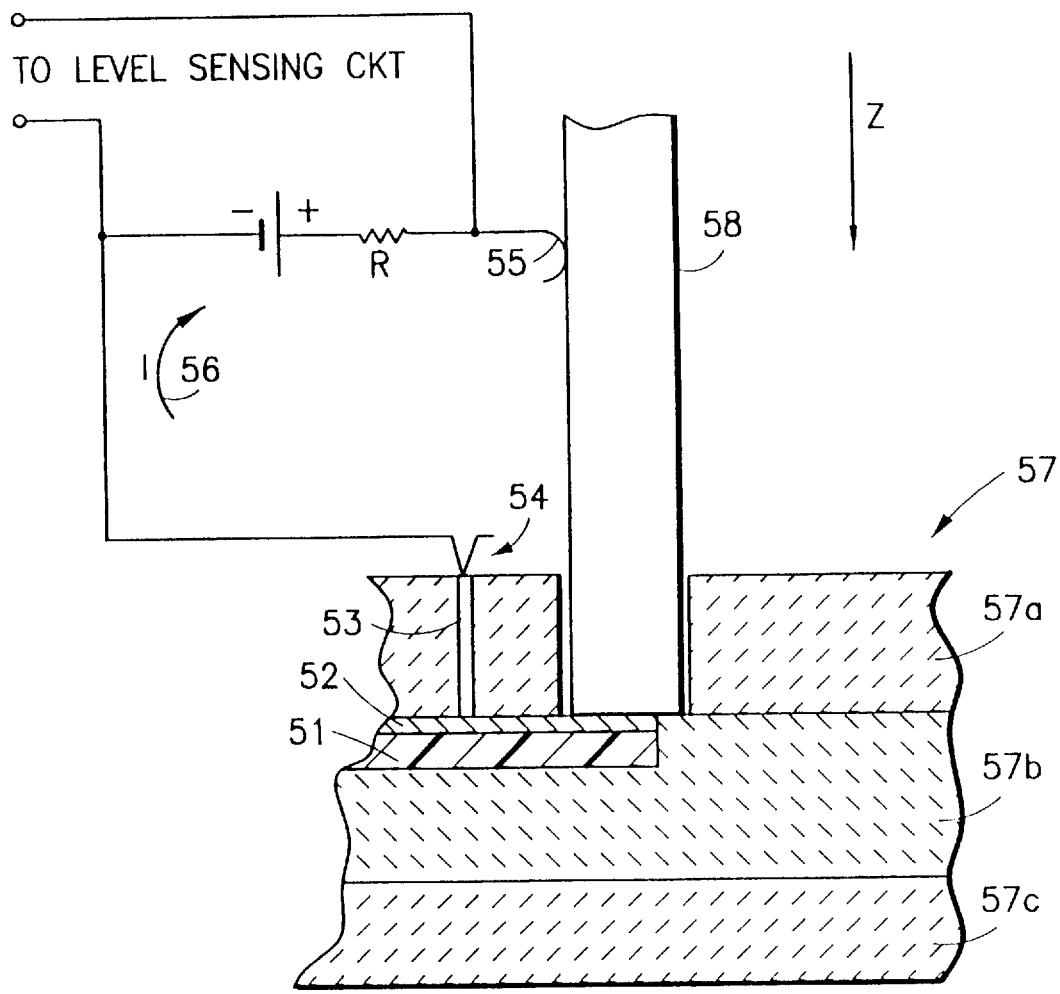
FIG. 13 illustrates the use of electrical sensing using DC techniques to control the depth of cut to a barrier layer.

The location of the center of a 10-layer laminate, for example, can vary by approximately 2.5 mils, which is greater than the thickness of the barrier layer. To automate the depth control, electronic sensing methods may be used, as illustrated by FIG. 13.

The barrier layer, for example a film 51 of Mylar, is coated with a very thin layer 52 of conductive material such as aluminum. This at least partially conductive barrier layer is cut and laminated within the laminate 57 as described in connection with FIGS. 1 and 2, for example. The conductive layer 52 can be electrically connected at contact 54 to an external sensing circuit using internal substrate wiring designed for this purpose. This method can use DC sensing to detect when a conductive milling cutter 58, connected to a circuit through slip ring 55, touches the barrier layer's conductive surface 52, thereby completing the circuit, causing a DC current (I) 56 to flow, which is detected by circuits not shown and used to control the milling machine. In operation, the rotating cutter 58 is slowly advanced into the upper greensheet layer 57a of the laminate of layers 57a, 57b and 57c in the Z direction and its contact with the conductive barrier 52 detected. The Z position is recorded in a computer and this is used to control (stop) the Z axis travel of the cutter. The cutter is then traversed around the barrier layer, through the overlying greensheet layer, and the cavity milled. Additionally, the cutter 58 can be made to plunge and detect contact with the barrier layer in three or more places and a best fit plane calculated from the data to allow for very accurate depth control of the milling cutter 58 when using a computer controlled milling machine.

This method works well but requires that the substrate wiring be re-designed to accommodate the electrical connection 53 to the internal barrier layer and also requires a substrate holding fixture incorporating contact 54 to connect to the internal wiring connected to the metallized barrier layer 51. Additionally, the resistance of unfired wiring metallurgy can be very high, making DC sensing sometimes difficult.

Figure 14:
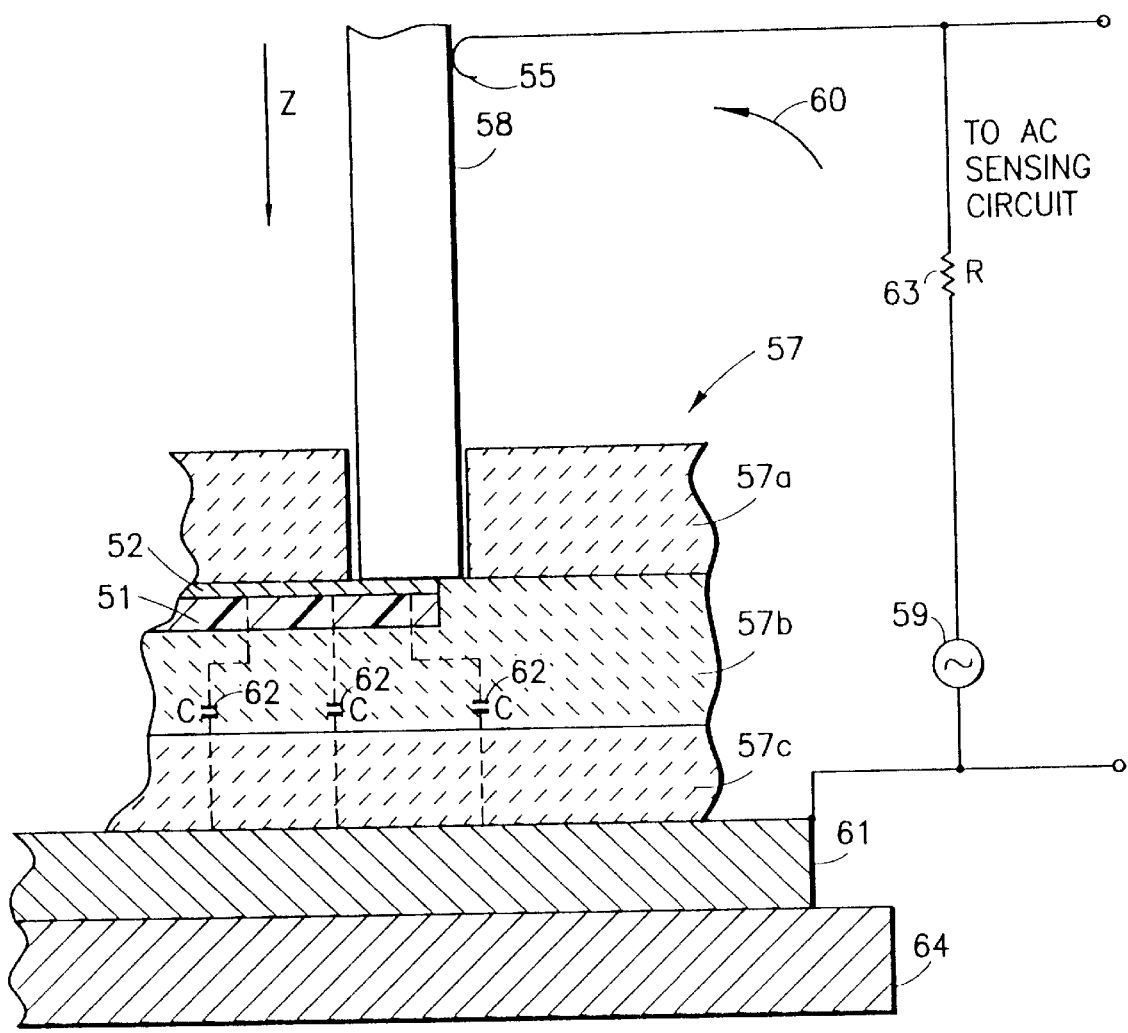
FIG. 14 illustrates the use of electrical sensing using AC techniques to control the depth of cut to a barrier layer.

An alternate and superior method of electronic cutter depth control utilizes a high frequency AC circuit, rather than a DC circuit as shown in FIG. 14. This eliminates the need for a direct, internal, wiring connection to the conductive barrier layer imbedded within the laminate, as required in the DC sensing technique illustrated by FIG. 13.

This method utilizes the inherent capacitance (C) 62 which exists between the conductive barrier layer coating 52 and conductive work holding chuck 61, on an insulating support 64, to provide a path for AC current flow. The unfired ceramic material of the greensheet layers 57a, 57b and 57c has a dielectric constant greater than one and a high DC resistance.

The electronic AC sensing circuits can incorporate narrow band pass filters, not shown, centered at the frequency of the AC signal source 59 to provide for improved noise immunity.

In operation, little current (i) 60 flows in the circuit until the conductive cutter 58 contacts the conductive barrier layer 52 thus greatly increasing the inherent circuit capacitance (c) through the barrier layer 51 and greensheet layers 57b and 57c, shown in phantom in FIG. 14 as capacitance paths 62, and therefore the total current flow (i) 60. This current flow increase results in an increased voltage drop across resistor (R) 63 and this change is detected by circuits not shown and used to control the depth of cut as described in the DC sensing technique.

In addition impulse techniques can be utilized, rather than AC to provide similar detection capabilities as will be apparent to those skilled in the art. These electronic depth sensing and control methods can also be applied to the milling of cavities by utilizing screened metallurgy areas as detectable depth sensing targets. These metallurgy areas can also function as a barrier layer.

It should be understood that the foregoing description is only illustrative of the invention. Various alternatives and modifications can be devised by those skilled in the art without departing from the invention. Accordingly, the present invention is intended to embrace all such alternatives, modifications and variances,which fall within the scope of the appended claims.

What is claimed is:

1. Process for producing multi-layer ceramic components having features which extend beneath the surface thereof, comprising the steps of:
   (a) producing a plurality of ceramic greensheet layers;
   (b) laminating said plurality of ceramic greensheet layers, the top ceramic greensheet layer comprising an adhering layer of masking material at the outermost surface of the laminate;
   (c) milling through said masking layer and through a portion of the thickness of the ceramic greensheet layers to form recessed areas;
   (d) filling said recessed areas with conductive pastes; and
   (e) removing said masking layer to provide conductive surface features which extend below the surface of the laminate.

2. Process in claim 1 in which said greensheet masking layer is removed by mechanical milling or grinding operations.

3. Process according to claim 1 which comprises sintering the laminate of step (e), and grinding or planarizing the outermost surface of the sintered laminate to produce a planar surface having metallized features which extend beneath the surface and which are not removed during planarization due to their depth.

4. Process according to claim 3 in which the exposed surface features comprise conductive metallurgy which is connected to metallization within the component.

5. Process according to claim 1 in which the ceramic greensheet layers used in step (a) are provided with punched and metallized vias to produce a ceramic chip carrier or circuit board.

6. Process according to claim 5 in which said metallized vias are thereafter connected to the conductive surface features at the surface of the laminate.

7. Process for producing a multilayer ceramic non-planar component with a recessed or raised feature having metallized sidewalls comprising the steps of:

(a) producing a plurality of ceramic greensheet layers;

(b) laminating said plurality of ceramic greensheet layers, the top greensheet layer comprising an adhering layer of masking material at the outermost surface of the laminate;

(c) milling through said masking layer and through a portion of the thickness of the ceramic greensheet layers to form recessed areas which comprise the outline perimeter of a proposed recessed or raised feature;

(d) filling the recessed areas around said outline perimeter with conductive paste, curing the conductive paste, partially cutting through the cured conductive paste around said outline perimeter to a predetermined depth of said recessed areas, removing the greensheet layers internal or external to said outline perimeter; and (e) removing said masking layer to form a non-planar component with a recessed or raised feature having metallized sidewalls.

8. Process according to claim 7 in which a patterned layer of barrier material is applied between two of said ceramic greensheet layers, and the predetermined depth of said recessed areas extend down to overlap the periphery of said layer of barrier material.

* * * * *